United States Patent
Chan

(10) Patent No.: US 12,495,672 B2
(45) Date of Patent: Dec. 9, 2025

(54) LIGHT TRANSMITTING DISPLAY PANEL, MANUFACTURING METHOD THEREOF AND DISPLAY DEVICE

(71) Applicant: Hefei Visionox Technology Co., Ltd., Anhui (CN)

(72) Inventor: Huang-Tai Chan, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 478 days.

(21) Appl. No.: 17/991,070

(22) Filed: Nov. 21, 2022

(65) Prior Publication Data

US 2023/0088366 A1    Mar. 23, 2023

Related U.S. Application Data

(63) Continuation of application No. PCT/CN2021/105783, filed on Jul. 12, 2021.

(30) Foreign Application Priority Data

Oct. 21, 2020    (CN) .......................... 202011130639.3

(51) Int. Cl.
   *H10K 50/86*    (2023.01)
   *H10K 59/12*    (2023.01)
   *H10K 59/35*    (2023.01)
   *H10K 71/00*    (2023.01)

(52) U.S. Cl.
   CPC ......... *H10K 50/865* (2023.02); *H10K 59/352* (2023.02); *H10K 71/00* (2023.02); *H10K 59/12* (2023.02); *H10K 59/1201* (2023.02)

(58) Field of Classification Search
   None
   See application file for complete search history.

(56) References Cited

U.S. PATENT DOCUMENTS

| | | |
|---|---|---|
| 2012/0320445 A1 | 12/2012 | Yang et al. |
| 2015/0185546 A1 | 7/2015 | Lee et al. |
| 2019/0259349 A1* | 8/2019 | Kaise ................ G02F 1/134309 |

(Continued)

FOREIGN PATENT DOCUMENTS

| | | |
|---|---|---|
| CN | 103809323 A | 5/2014 |
| CN | 103928489 A | 7/2014 |

(Continued)

OTHER PUBLICATIONS

Notice of Grant issued on Jan. 11, 2023, in corresponding Chinese Application No. 202011130639.3, 7 pages.

(Continued)

*Primary Examiner* — Michael Lebentritt
(74) *Attorney, Agent, or Firm* — Maier & Maier, PLLC

(57) ABSTRACT

A light-transmitting display panel, a manufacturing method thereof and a display device. The light-transmitting display panel includes a substrate and a light-emitting device layer disposed on the substrate, the light-emitting device layer including a plurality of pixel units and a shielding layer with a plurality of openings, each of the pixel units disposed correspondingly in one of the openings, and each pixel unit including a transparent light transmission portion and a plurality of sub-pixels emitting light of at least three colors distributed around the transparent light transmission portion.

20 Claims, 3 Drawing Sheets

(56) References Cited

U.S. PATENT DOCUMENTS

| | | |
|---|---|---|
| 2020/0328197 A1 | 10/2020 | Han et al. |
| 2023/0240102 A1* | 7/2023 | Wu .................... H10K 71/00 |
| 2023/0299095 A1* | 9/2023 | Liu .................... H10D 86/451 |

FOREIGN PATENT DOCUMENTS

| | | | | |
|---|---|---|---|---|
| CN | 104299523 A | | 1/2015 | |
| CN | 204513254 U | | 7/2015 | |
| CN | 106373982 A | | 2/2017 | |
| CN | 106940492 A | | 7/2017 | |
| CN | 107564945 A | | 1/2018 | |
| CN | 108010952 A | | 5/2018 | |
| CN | 110112189 A | | 8/2019 | |
| CN | 110262115 A | | 9/2019 | |
| CN | 110289286 A | | 9/2019 | |
| CN | 110323259 A | | 10/2019 | |
| CN | 110349993 A | | 10/2019 | |
| CN | 110491924 A | | 11/2019 | |
| CN | 209766422 U | | 12/2019 | |
| CN | 110783394 A | | 2/2020 | |
| CN | 111323962 A | | 6/2020 | |
| CN | 111341804 A | | 6/2020 | |
| CN | 211238258 U | | 8/2020 | |
| CN | 111640776 A | | 9/2020 | |
| CN | 111653590 A | | 9/2020 | |
| CN | 112258986 A | | 1/2021 | |
| CN | 116259264 A | * | 6/2023 | |
| CN | 112088410 B | * | 8/2023 | ........... B32B 27/281 |
| CN | 118660575 A | * | 9/2024 | |
| JP | 2019168629 A | | 10/2019 | |
| KR | 20060019214 A | | 3/2006 | |
| KR | 1020100001598 A | | 1/2010 | |
| KR | 1020150117359 A | | 10/2015 | |
| KR | 1020160047061 A | | 5/2016 | |
| WO | 2016015385 A1 | | 2/2016 | |
| WO | WO-2017043516 A1 | * | 3/2017 | ............. G02B 26/02 |
| WO | WO-2021215153 A1 | * | 10/2021 | |

OTHER PUBLICATIONS

International Search Report issued on Aug. 27, 2021, in corresponding International Application No. PCT/CN2021/105783, 8 pages.

Office Action issued on Feb. 7, 2022, in related Chinese Patent Application No. 202011130639.3, 19 pages.

Office Action issued on Jul. 15, 2022, in related Chinese Patent Application No. 202011130639.3, 18 pages.

Office Action issued on Sep. 13, 2024, in corresponding Korean Application No. 10-2022-7040713, 17 pages.

\* cited by examiner

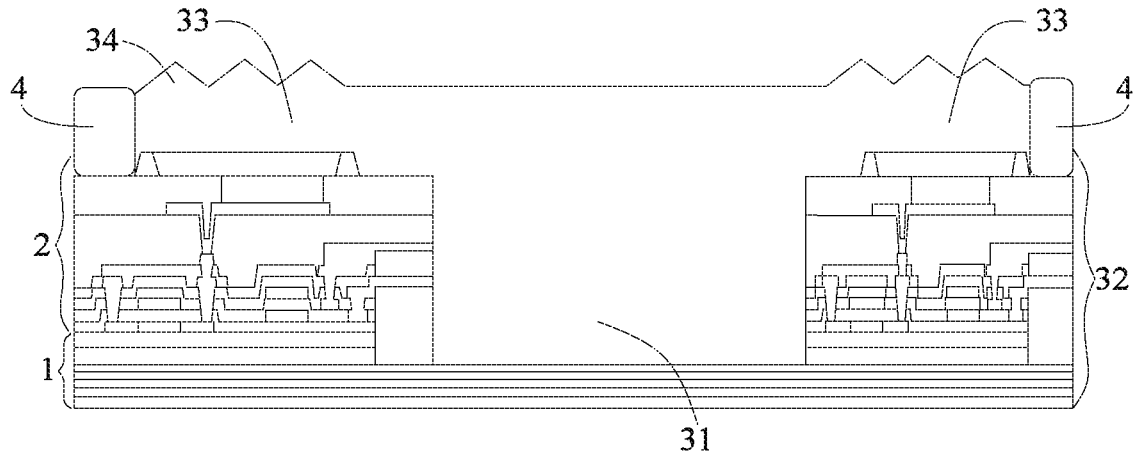

Fig. 2

```
forming a plurality of pixel units on a substrate,
each of the pixel units including a transparent
light-transmitting portion and a plurality of sub-
pixels emitting light of at least three colors
distributed around the transparent light-
transmitting portion
```
— S101

```
forming a shielding layer between adjacent pixel
units, the shielding layer including openings
corresponding to the pixel units one-to-one, and
the pixel units being located in the openings
```
— S102

Fig. 3

LIGHT TRANSMITTING DISPLAY PANEL, MANUFACTURING METHOD THEREOF AND DISPLAY DEVICE

CROSS-REFERENCE TO RELATED APPLICATIONS

The present application is a continuation of International Application No. PCT/CN2021/105783 filed on Jul. 12, 2021, which claims the priority to Chinese patent application No. 202011130639.3 filed on Oct. 21, 2020, both of which are incorporated herein by reference in their entireties.

TECHNICAL FIELD

The present application relates to the technical field of display devices, and particularly to a light-transmitting display panel, a manufacturing method thereof and a display device.

BACKGROUND

Current and future demands have put forward new requirements on a display terminal in vehicle. The display terminal in vehicles will develop towards directions of no influence, what you see is what you get (WYSIWYG) and broad vision, so as to achieve improvements in both the display effect and user's visual range. That is to say, it is necessary to meet high requirements for strong visibility and moderate brightness, and meantime guaranteeing the user's visual range.

Currently, the display terminal in vehicle use a conventional display panel, a transparent display screen or a specific projection display screen. The conventional display panel cannot allow a line of sight to penetrate, resulting in a small visible area and a problem of influences on the user's visual range. The present transparent display screen vacates a transparent area by a way of concentrating pixels, but there are problems of a small effective area of pixels and poor visibility, and thus it is necessary to intensify the brightness to improve an interpretation ability, but the intensified brightness would cause a problem of dazzling people's eyes. For the present projection display screen, there are problems that intense reflection may affect interpretation, display deformation may be caused by an uneven projection surface, it is difficult to read under strong light, and the visibility is relatively poor. Therefore, it is hard for the display effect of any current display terminal to meet the requirements for improvements in both the display effect and the user's visual range.

SUMMARY

The present application provides a light-transmitting display panel, a manufacturing method thereof and a display device. The light-transmitting display panel can achieve improvements in both the display effect of display screen and the user's visual range.

An aspect of the present application provides a light-transmitting display panel, including: a substrate and a light-emitting device layer disposed on the substrate, the light-emitting device layer including a plurality of pixel units and a shielding layer with a plurality of openings, each of the pixel units deposited correspondingly in one of the openings, and each of the pixel units including a transparent light transmission portion and a plurality of sub-pixels emitting light of at least three colors distributed around the transparent light transmission portion.

Another aspect of the present application provides a manufacturing method of a light-transmitting display panel, including: forming a plurality of pixel units on the substrate, each of the pixel units including a transparent light transmission portion and a plurality of sub-pixels emitting light of at least three colors distributed around the transparent light transmission portion; and forming a shielding layer between adjacent pixel units, the shielding layer including openings corresponding to the pixel units one-to-one, the pixel units being located in the openings.

Another aspect of the present application provides a display device including the light-transmitting display panel mentioned above.

In the light-transmitting display panel provided by the present application, the transparent light transmission portion can have the effect of light conduction, and light emitted by the sub-pixels of three colors distributed around the transparent light transmission portion can come into the transparent light transmission portion and can be emitted after mixed through the transparent light transmission portion, and thus the transparent light transmission portion can also have a display function, so that each pixel unit can be changed from a point light source into an area light source, while the brightness of the light-transmitting display panel can be reduced. As a result, the light-transmitting display panel can have stronger visibility, a moderate luminous intensity, to meet reading needs during driving. Adjacent pixel units can be isolated by the shielding layer, so that light of the adjacent pixel units can be prevented from mixing, so as to further improve the display effect. At the same time, the transparent light transmission portion can have the light-transmitting effect, so that the light-transmitting ability of the light-transmitting display panel can be improved, to expand the user's visual range and improve the safety factor of driving. The light-transmitting display panel provided by the present application can have the strong visibility and moderate brightness, while guaranteeing the user's visual range, and thus can achieve the improvements in both the display effect and the user's the visual range.

BRIEF DESCRIPTION OF THE DRAWINGS

FIG. 2 is a schematic view of a film layer structure of the light-transmitting display panel shown in FIG. 1;

FIG. 3 is a flow chart of a manufacturing method of the light-transmitting display panel shown in FIG. 2.

DETAILED DESCRIPTION

Features and exemplary embodiments of various aspects of the present application will be described in details below. In the following detailed description, numerous specific details are set forth in order to provide a thorough understanding of the present application. However, it will be apparent to those skilled in the art that the present application may be practiced without some of these specific details. The following description of embodiments is only intended to provide a better understanding of the application by illustrating examples of the present application.

In order to better understand the present application, the light-transmitting display panel, the manufacturing method thereof and the display device provided by the present application will be described in details below with reference to FIG. 1 and FIG. 2.

Figure 1:
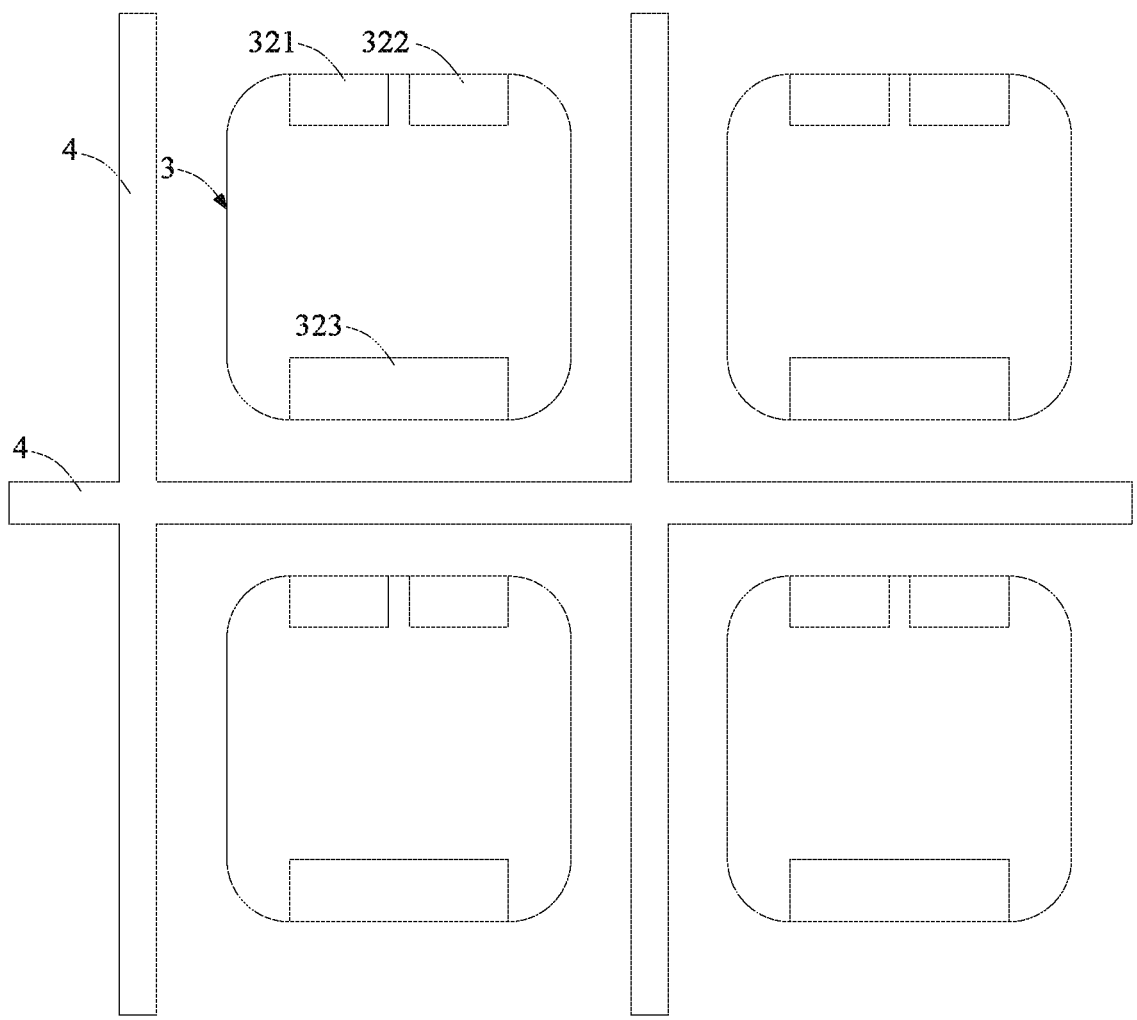
FIG. 1 is a schematic structural view of a light-transmitting display panel provided by the present application.

As shown in FIG. 1 and FIG. 2, the present application provides a light-transmitting display panel. The light-transmitting display panel includes a substrate 1 and a light-emitting device layer 2 disposed on the substrate 1. The light-emitting device layer 2 includes a shielding layer 4 with a plurality of openings and a plurality of pixel units 3. Each of the pixel units 3 is disposed correspondingly in one of the openings. Each of the pixel units 3 includes a transparent light transmission portion 31 and a plurality of sub-pixels 32 emitting light of at least three colors distributed around the transparent light transmission portion 31.

In the light-transmitting display panel provided by the present application, the transparent light transmission portion 31 can have the effect of light conduction, and light emitted by the sub-pixels 32 of three colors distributed around the transparent light transmission portion 31 can come into the transparent light transmission portion 31 and can be emitted after mixed through the transparent light transmission portion 31, and thus the transparent light transmission portion 31 can also have a display function, so that each pixel unit 3 can be changed from a point light source into an area light source while the brightness of the light-transmitting display panel can be reduced. As a result, the light-transmitting display panel can have stronger visibility, a moderate luminous intensity, to meet reading needs during driving. Adjacent pixel units 3 can be isolated by the shielding layer 4, so that light of the adjacent pixel units 3 can be prevented from mixing, so as to further improve the display effect. At the same time, the transparent light transmission portion 31 can have the light-transmitting effect, so that the light-transmitting ability of the light-transmitting display panel can be improved, to expand the user's visual range and improve the safety factor of driving. The light-transmitting display panel provided by the present application can have the strong visibility and moderate brightness, while guaranteeing the user's visual range, and thus achieve the improvements in both the display effect and the user's visual range.

Each of the pixel units 3 may include a red sub-pixel 321, a green sub-pixel 322 and a blue sub-pixel 323, the red sub-pixel 321 and the green sub-pixel 322 may be disposed adjacently to each other, and each of the red sub-pixel 321 and the green sub-pixel 322 may be disposed oppositely to the blue sub-pixel 323.

An area of each of the red sub-pixel 321 and the green sub-pixel 322 may be smaller than an area of the blue sub-pixel 323. The red sub-pixel 321 and the green sub-pixel 322 are disposed adjacently to each other, each of the red sub-pixel 321 and the green sub-pixel 322 is disposed oppositely to the blue sub-pixel 323, and opposite sides of the three sub-pixels are long sides of the three sub-pixels, so that light of the sub-pixels of three colors may be fully mixed in the transparent light transmission portion 31 to improve the display effect.

In each pixel unit, there may be the transparent light transmission portion 31 between the red sub-pixel 321 and the green sub-pixel 322, and between the blue sub-pixel 323 and each of the red sub-pixel 321 and the green sub-pixel 322. Light emitted by the red sub-pixel 321, the green sub-pixel 322 and the blue sub-pixel 323 may enter the transparent light transmission portion 31 for light mixing. In this application, each pixel unit is changed from a point light source into an area light source, by enlarging the size of each pixel unit and disposing the transparent light transmission portion 31 between every two sub-pixels for light mixing, light conducting and light transmitting, so that the light uniformity can be improved while the display brightness can be reduced to prevent the dazzling phenomenon and the light-transmitting effect of each pixel unit can be increased, so as to greatly improve the light transmittance of the entire light-transmitting display panel, and thereby expand the user's visual range.

Each pixel unit 3 may further include a transparent light-conducive layer 33 located on a side of the pixel unit 3 away from the substrate 1. The transparent light-conductive layer 33 may further mix the light of the sub-pixels of three colors in the pixel unit 3, so that the light emitted by the entire pixel unit 3 can be evener, and thereby the display effect can be further improved.

The transparent light-conductive layer 33 is disposed on a pixel unit 3, the transparent light transmission portion 31 is located between every two sub-pixels in the pixel unit 3, and the transparent light transmission portion 31 is surrounded by each sub-pixel. The transparent light transmission layer 33 and the transparent light transmission portion 31 can cooperate to fully mix light emitted by each sub-pixel along multiple directions toward the transparent light transmission portion 31 and toward the transparent light-conductive layer 33, so that the display effect of each pixel unit 3 may be evener and the display effect of the light-transmitting display panel can be better.

A plurality of protrusions 34 may be formed on a side of the transparent light-conductive layer 33 away from the substrate 1 and the protrusions 34 correspond to the sub-pixels 32.

By depositing the protrusions 34 on the side of the transparent light-conductive layers 33 away from each sub-pixel 32, the light-conductive effect of the transparent light-conductive layers 33 may be further enhanced, so that the light emitted by each pixel unit 3 may be evener.

Specifically, in a cross section of each of the protrusions 34 along a direction perpendicular to the substrate 1, a shape of a contour line of a side away from the substrate 1 may be one of a zigzag line shape, a semicircular shape and a parabolic shape, or any other irregular shape, as long as the light can be further uniformed, and thus the specific shape is not limited in this application.

Specifically, the protrusions 34 may be manufactured by means of etching or developing, which is not limited in this application.

Both the transparent light transmission portion 31 and the transparent light-conductive layer 33 may be made of light-transmitting and color-mixable materials.

The transparent light transmission portion 31 and the transparent light-conductive layer 33 may be made of the same materials, so that the light may be prevented from being refracted between the transparent light transmission portion 31 and the transparent light-conductive layer 33, so as to guarantee the display effect; and the materials of the transparent light transmission portion 31 and the transparent light-conductive layers 33 may be selected to be transparent polyimides, and the transparent polyimides materials may have good light mixing and light transmitting effects and may be easily obtained.

The shielding layer 4 and the transparent light-conductive layer 33 may be disposed in the same layer.

By disposing the shielding layer 4 and the transparent light-conductive layer 33 in the same layer, the space between the pixel units 3 may not occupied, so that the resolution of the light-transmitting display panel can be guaranteed, and at the same time, by only disposing the shielding layer 4 in the same layer as the transparent light-conductive layer 33, a thickness of the shielding layer 4 can be reduced while the light blocking effect can be satisfied, so as to save the materials of the shielding layer 4 and achieve a good effect of preventing light from mixing.

The shielding layer 4 may include a plurality of black matrixes.

Using the plurality of black matrixes, colors of adjacent pixel units 3, especially colors of adjacent sub-pixels 32 of the adjacent pixel units 3, can be prevented from mixing. Light emitted by the adjacent pixel units 3 may be isolated by the plurality of black matrixes, so that each pixel unit 3 may emit light independently and without interference with each other, and thus the display effect of the entire light-transmitting display panel can be better.

The present application further provides a manufacturing method of the above-mentioned light-transmitting display panel, as shown in FIG. 3. The manufacturing method includes:

S101, forming a plurality of pixel units 3 may be formed on a substrate 1, each of the pixel units 3 including a transparent light transmission portion 31 and a plurality of sub-pixels 32 emitting light of at least three colors distributed around the transparent light transmission portion 31; and S102, forming a shielding layer 4 between adjacent pixel units 3, the shielding layer 4 including openings corresponding to the pixel units one-to-one, and the pixel units being located in the openings.

In the manufacturing method above, the pixel units 3 are manufactured firstly, and then the shielding layer 4 is manufactured. The shielding layer 4 is located between adjacent pixel units 3, so as to isolate the adjacent pixel units 3 to prevent light from mixing. Each of the pixel units 3 includes the transparent light transmission portion 31 and the plurality of sub-pixels 32 emitting light of at least three colors, and each of the sub-pixels 32 is distributed around the transparent light transmission portion 31, so that light emitted by each of the sub-pixels 32 can be fully mixed in the transparent light transmission portion 31, and thereby the point light source of each of the sub-pixels 32 can be changed into the area light source of the entire pixel unit 3 to improve the display effect. Additionally, the transparent light transmission portion 31 can transmit light, so as to increase the user's visual range during driving, so that the light-transmitting display panel will not block the user's line of sight when applied to on-vehicle equipment and thereby can improve the driving safety.

Figure 4:
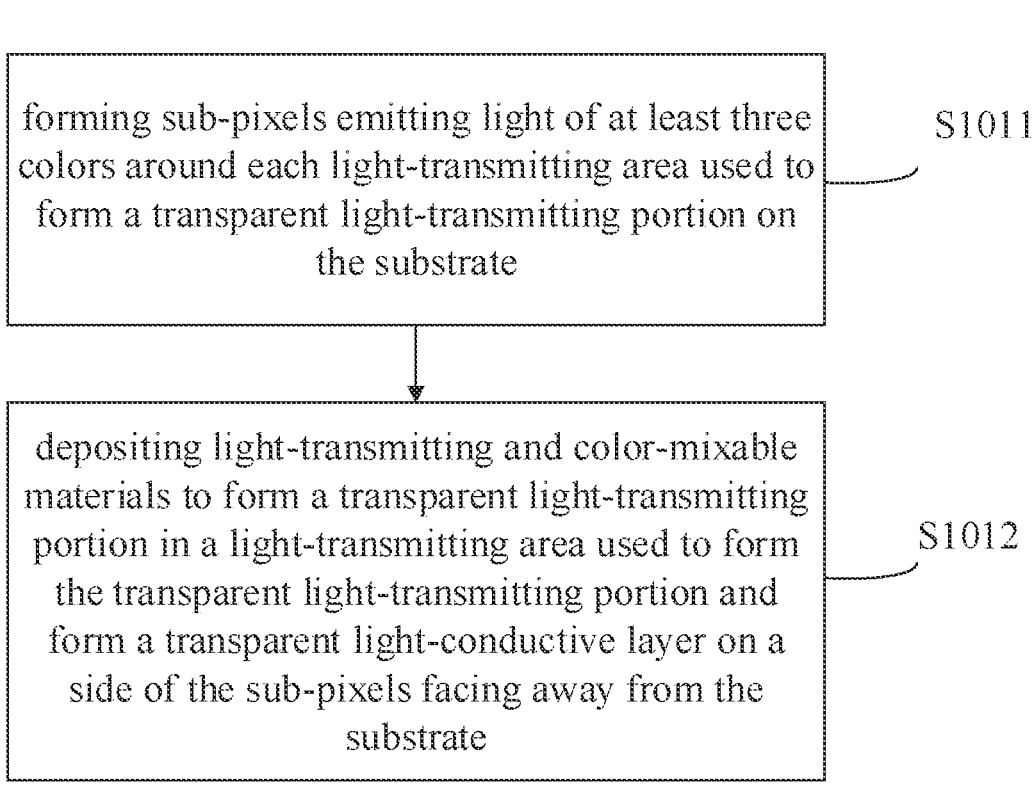
FIG. 4 is a manufacturing flow chart of the first step in the manufacturing method of the light-transmitting display panel shown in FIG. 3.

As shown in FIG. 4, in the above-mentioned manufacturing method for manufacturing the light-transmitting display panel, the step S101 may include:

S1011, forming sub-pixels 32 emitting light of at least three colors around each light-transmitting area used to form a transparent light transmission portion 31 on the substrate 1; and S1012, depositing light-transmitting and color-mixable materials to form the transparent light transmission portion 31 in a light-transmitting area used to form the transparent light transmission portion 31 and form a transparent light-conductive layer 33 on a side of the sub-pixels 32 away from the substrate 1.

The transparent light transmission portion 31 and the transparent light-conductive layer 33 can be made of the same materials and manufactured in the same process, so as to prevent light, when passing through the transparent light transmission portion 31 and the transparent light-conductive layer 33 in sequence, from being refracted at the junction of the transparent light transmission portion 31 and the transparent light-conductive layer 33, to guarantee the visual effect. At the same time, the transparent light transmission portion 31 and the transparent light-conductive layer 33 can be manufactured in one process, so as to simplify the manufacturing process and thereby save the manufacturing time. The light-transmitting area may include a transparent layer disposed on the substrate 1, and the transparent light transmission portion 31 may be disposed on the transparent layer. The transparent layer may include film layers such as a blocking layer, an insulation layer, and a flat layer, etc.

The manufacturing method of the light-transmitting display panel of the present application may further include forming a plurality of protrusions 34 on a side of the transparent light-conductive layers 33 away from the substrate 1 correspondingly to the sub-pixels. The protrusions 34 may be formed by means of etching or developing.

The present application further provides a display device including the light-transmitting display panel mentioned above.

The display device may be used in a vehicle that needs a display device to be built in the vehicle. The display device can have strong visibility and moderate brightness, while guaranteeing the user's visual range, and thus can achieve the improvements in both the display effect and the user's visual range. Therefore, the display device can avoid blocking the user's line-of-sight, while guaranteeing the visual effect of the display device, and thereby the driving safety can be improved. The display device is not be limited to being applied to a vehicle, but can be applied to other occasions according to actual needs, which is not limited in this application.

The above provides only specific implementations of the present application. Those skilled in the art can clearly understand that various modifications and variations can be made to the embodiments of the present application without departing from the spirit and scope of the application. As such, if these modifications and variations of the present application fall within the scope of the claims of the present application and their equivalents, the present application is also intended to incorporate these modifications and variations.

What is claimed is:

1. A light-transmitting display panel, comprising:
   a substrate; and
   a light-emitting device layer disposed on the substrate, the light-emitting device layer comprising a plurality of pixel units and a shielding layer with a plurality of openings, the plurality of pixel units comprising a transparent light transmission portion and a plurality of sub-pixels emitting light of at least three colors,
   sub-pixels of two colors of the at least three colors are set adjacent to each other, and set opposite to sub-pixels of a third color;
   the transparent light transmission portion is located between the sub-pixels of the two colors and the sub-pixels of the third color;
   the shielding layer is disposed on a side of the plurality of pixel units away from the substrate.

2. The light-transmitting display panel of claim 1, further comprising:
   a transparent light-conductive layer located on a side of the plurality of pixel units away from the substrate.

3. The light-transmitting display panel of claim 2, wherein a plurality of protrusions is formed on a side of the transparent light-conductive layer away from the substrate and the plurality of protrusions corresponds to the plurality of sub-pixels.

4. The light-transmitting display panel of claim 3, wherein, in a cross section of each protrusion of the plurality of protrusions along a direction perpendicular to the substrate, a shape of a contour line of a side of each protrusion away from the substrate comprises one of a zigzag line shape, a semicircular shape and a parabolic shape.

5. The light-transmitting display panel of claim 2, wherein the transparent light transmission portion and the transparent light-conductive layer are made of light-transmitting and color-mixable materials.

6. The light-transmitting display panel of claim 5, wherein the transparent light transmission portion and the transparent light-conductive layer are made of same materials.

7. The light-transmitting display panel of claim 6, wherein the transparent light transmission portion and the transparent light-conductive layer are made of transparent polyimides.

8. The light-transmitting display panel of claim 2, wherein the shielding layer and the transparent light-conductive layer are disposed in a same layer.

9. The light-transmitting display panel of claim 1, wherein the shielding layer comprises a plurality of black matrixes.

10. The light-transmitting display panel of claim 1, wherein the transparent light transmission portion is located between sub-pixels of three adjacent colors.

11. The light-transmitting display panel of claim 10, wherein an area of the red sub-pixel is smaller than an area of the blue sub-pixel and an area of the green sub-pixel is smaller than the area of the blue sub-pixel.

12. A manufacturing method comprising:
    forming a plurality of pixel units on a substrate, each pixel unit of the plurality of pixel units comprising a transparent light transmission portion and the plurality of sub-pixels emitting light of at least three colors distributed around the transparent light transmission portion; and
    forming a shielding layer between adjacent pixel units, the shielding layer comprising a plurality of openings corresponding to the plurality of pixel units one-to-one, wherein the shielding layer is disposed on a side of the plurality of pixel units away from the substrate.

13. The manufacturing method of claim 12, wherein forming the plurality of pixel units on the substrate further comprises:
    forming a plurality of sub-pixels emitting light of at least three colors around each light-transmitting area used to form a transparent light transmission portion on the substrate; and
    depositing light-transmitting and color-mixable materials to form a transparent light transmission portion in a light-transmitting area used to form the transparent light transmission portion and form the transparent light-conductive layer on a side of the plurality of sub-pixels away from the substrate.

14. The manufacturing method of claim 13, wherein the transparent light transmission portion and the transparent light-conductive layer are made of same materials and manufactured in a same process.

15. The manufacturing method of claim 14, wherein the transparent light transmission portion and the transparent light-conductive layer are made of transparent polyimides.

16. The manufacturing method of claim 13, wherein the light-transmitting area comprises a transparent layer disposed on the substrate, the transparent light transmission portion is disposed on the transparent layer, and the transparent layer comprises a blocking layer, an insulation layer, and a flat layer.

17. The manufacturing method of claim 13, wherein the plurality of protrusions is formed at positions each corresponding to one sub-pixel of the plurality of sub-pixels.

18. A display device, comprising the light-transmitting display panel of claim 1.

19. A light-transmitting display panel, comprising:
    a substrate; and
    a light-emitting device layer disposed on the substrate, the light-emitting device layer comprising a plurality of pixel units and a shielding layer with a plurality of openings,
    the plurality of pixel units comprising a transparent light transmission portion and a plurality of sub-pixels emitting light of at least three colors distributed around the transparent light transmission portion;
    the shielding layer is disposed on a side of the plurality of pixel units away from the substrate.

20. The light-transmitting display panel of claim 1, wherein the transparent light transmission portion is located between sub-pixels of three adjacent colors.

* * * * *